United States Patent [19]
Komura et al.

[11] Patent Number: 5,423,941
[45] Date of Patent: Jun. 13, 1995

[54] DRY ETCHING PROCESS FOR SEMICONDUCTOR

[75] Inventors: Atsushi Komura, Obu; Yoshikazu Sakano, Chita; Kenji Kondo, Hoi; Keiichi Kon, Aiko; Tetsuhiko Sanbei, Narita; Shoji Miura, Anjo, all of Japan

[73] Assignee: Nippondenso Co., Ltd., Kariya, Japan

[21] Appl. No.: 152,896

[22] Filed: Nov. 17, 1993

[30] Foreign Application Priority Data

Nov. 18, 1992 [JP] Japan ................... 4-333639

[51] Int. Cl.$^6$ .............................. C23F 1/00
[52] U.S. Cl. .............................. 156/643.1
[58] Field of Search ............... 156/643, 646, 662, 653, 156/657

[56] References Cited

U.S. PATENT DOCUMENTS

| | | | |
|---|---|---|---|
| 4,208,241 | 6/1980 | Harshbarger et al. | 156/643 |
| 4,226,665 | 10/1980 | Mogab | 156/643 |
| 4,256,634 | 3/1981 | Levinstein et al. | 156/643 |
| 4,450,042 | 5/1984 | Purdes | 156/643 |
| 4,784,720 | 11/1988 | Douglas | 156/643 |
| 4,855,017 | 8/1989 | Douglas | 156/643 |
| 5,078,833 | 1/1992 | Kadomura | 156/643 |

Primary Examiner—Robert Kunemund
Assistant Examiner—Joni Y. Chang
Attorney, Agent, or Firm—Cushman, Darby & Cushman

[57] ABSTRACT

A process for forming deep trenches on a surface of a semiconductor substrate by forming a mask on the surface of the semiconductor, which prescribes the position of the trenches; and then dry etching the semiconductor surface using a gas mixture comprising (1) an etchant, bromine containing, gas which etches the semiconductor surface to form trenches, (2) a cleaning, halogen containing, gas which evaporates the residue formed by the etching; and (3) a reactive gas capable of reacting with material formed during the etching and capable of decreasing the wastage of the mask by the etchant gas.

7 Claims, 7 Drawing Sheets

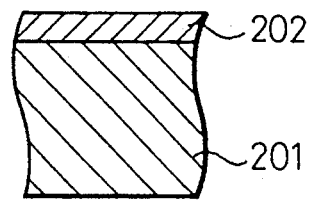
Fig. 2A
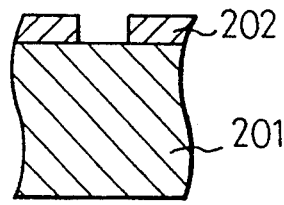
Fig. 2B
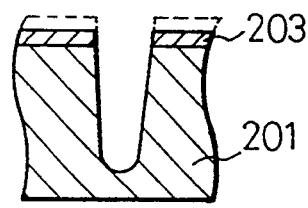
Fig. 2C
Fig. 3
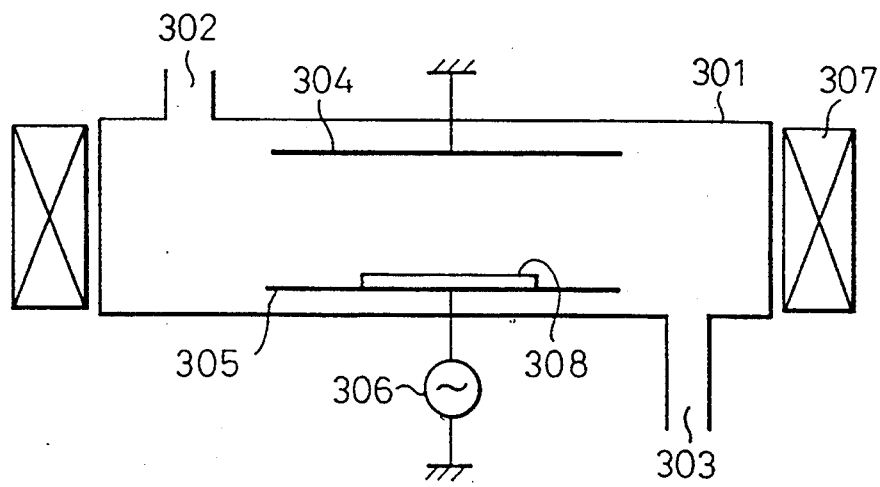
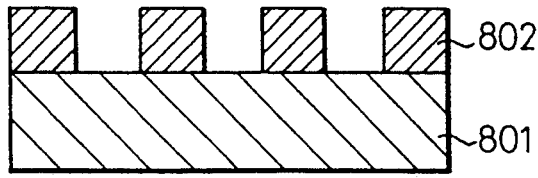
Fig. 4A
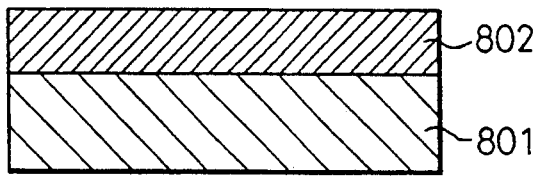
Fig. 4B

DRY ETCHING PROCESS FOR SEMICONDUCTOR

BACKGROUND OF THE INVENTION

1. Field of the Invention

This invention relates to a process of forming a trench or a deep hole, by dry etching, in a semiconductor substrate which is particularly useful for manufacturing an article made from Si, such as semiconductor DRAM device.

2. Description of the Related Art

Trenches formed by selectively digging down through a surface of a semiconductor are necessary to realize high integration and high voltage withstanding properties in a semiconductor device. The configuration of each of the trenches must have a side wall which is a little inclined to form a taper, has a smooth surface, and has a round bottom, as shown in FIG. 1A, from a view point of the manufacturing process and the characteristics of semiconductor devices. Thus, establishment of a technique for forming a trench having a good configuration is required. In FIG. 1A, 101 is silicon substrate and 102 is a side wall angle. Undesirable configurations of trenches are shown in FIG. 1B through FIG. 1H.

Heretofore, dry etching of Si for trenches (the same with deep holes, hereinafter only trenches being referred to) and others are conducted generally by using a fluorine-containing gas (hereinafter referred to as "F system gas"), a chlorine-containing gas (hereinafter referred to as "Cl system gas"), a bromine-containing gas (hereinafter referred to as "Br system gas"), etc., as disclosed in U.S. Pat. Nos. 4,226,665 and 4,208,241. Generally, forming a trench is conducted, as shown in FIGS. 2A through FIG. 2C, by forming an insulating mask of $SiO_2$ 202 over the Si substrate 201 (FIG. 1A), followed by forming a pattern in the mask, and then carrying out etching. Here, a description of further processes for forming integrated circuits is eliminated.

At present, forming of trenches can be performed by an RIE (Reactive Ion Etching) device in an atmosphere of the Br system gas, F system gas, Cl system gas, etc. However, a reliable and stable method as is applicable to commercial production is not yet known. Further, although oxygen gas is mixed for etching polycrystalline Si, it has not been mixed for etching single crystalline Si, because oxygen gas tends to create etching residue and the etching tends to be isotropic.

During forming of a trench, not only the Si substrate 201 is etched, but also the $SiO_2$ mask 202 is partially etched and becomes thin, as shown in FIG. 2C. The difficulty of mask diminishing is shown by "selectivity ratio against $SiO_2$". The selectivity ratio against $SiO_2$ is defined as a ratio of etching speed of semiconductor to etching speed of $SiO_2$. The larger the value thereof, the deeper the trench can be made. This is because at the place where the selectivity ratio against $SiO_2$ is small, the mask disappears before the trench is etched enough, and the Si of substrate which was under the $SiO_2$ is eroded. Therefore, an etching gas having a large selectivity ratio against $SiO_2$ is required. However, F system gas, which produces a highly volatile product, has generally low selectivity ratio against $SiO_2$, and has a problem that it tends to cause isotropic etching wherein an etching reaction proceed in all direction. Further, generally, F system gas, Cl system gas, and Br system gas, in this order, increase the amount of etching residue. The latter also gives a more ordered side wall configuration.

Prior art, as disclosed in U.S. Pat. No. 4,450,042, provides a general process for etching Si perpendicularly. This process, however, gives trenches of at most 5 μm in depth, and if one tries to etch more deeply, one cannot necessarily form satisfactory trenches having stable configurations and high accuracy, because the configurations of trenches lack uniformity, or if uniform configurations are pursued, much residue is formed. In some cases a mixture of gases are used in order to take advantage of various etching gases. However, an etching process has not yet been proposed which solves all of the problems at the same time, to provide a commercial production.

U.S. Pat. No. 4,784,720 discloses a process of controlling the trench configurations by selectively adhering reaction products onto the side walls of the trenches. However, this process pursues only configuration, and does not pay attention to other properties, e.g. selectivity ratio and etching residue, so that it is difficult to apply the process to mass production.

SUMMARY OF THE INVENTION

An object of this invention is to solve the above problems and to provide a method for producing, efficiently and with high accuracy, very deep trenches with regular configurations.

This invention relates to a process for forming trenches on a surface of a semiconductor substrate by forming a mask on the surface of the semiconductor which prescribes the position of the trenches; and dry etching the semiconductor surface using a gas mixture comprising an etchant gas comprising at least bromine (hereinafter referred to as "Br containing gas") which etches the semiconductor surface to form trenches, a cleaning gas comprising a halogen (hereinafter referred to as "X containing gas") which evaporates residue formed by said etching, and a reactive gas capable of reacting with material formed during the etching and of decreasing wastage of the mask by the etchant gas.

When etching is carried out with the above gas mixture, under appropriately set up values of parameters described in examples mentioned below, Br containing gas etches the semiconductor substrate, the X containing gas removes a product formed during etching, and the reactive gas protects the mask, to increase the selectivity ratio against $SiO_2$ and provide trenches having a desired configuration.

As made apparent from the later-mentioned Examples and Comparative Examples, the gas composition of this invention can greatly improve the selectivity ratio against $SiO_2$ and provide deep trenches, with a good reproducibility and with a good configuration, preserving a slight taper of trench side wall at an angle near 90°.

BRIEF DESCRIPTION OF THE DRAWING

FIGS. 2A through 2C are schematic cross sectional views representing a process of forming a trench.

FIG. 3 is a schematic structural cross sectional view of a magnetron RIE (Reactive Ion Etching) device used in Examples and Comparative Examples.

FIGS. 4A and 4B are cross sectional views of samples for confirmation of the effect of presence of $SiO_2$ mask pattern.

DETAILED DESCRIPTION OF THE INVENTION

Figure 1A:
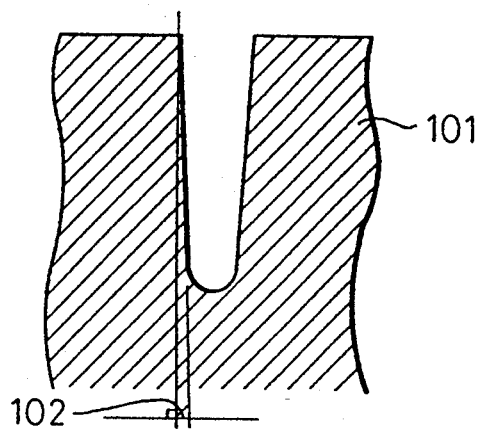
FIG. 1A is a cross sectional view of an ideal configuration of a trench.
Figures 1B, 1C, 1D:
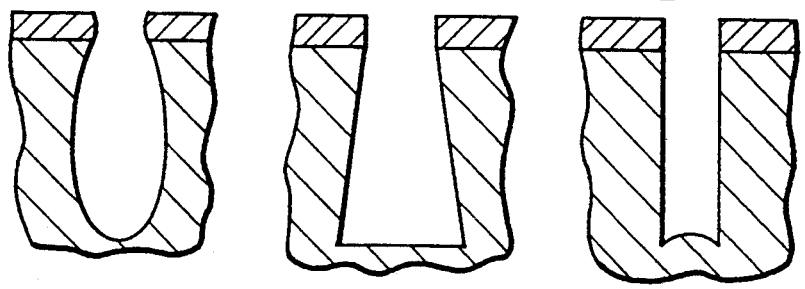
FIGS. 1B through 1H are cross sectional views of undesirable configurations of trenches.
Figures 1E, 1F, 1G:
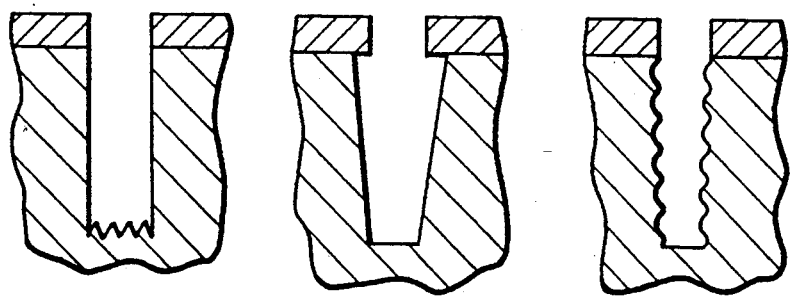
Figure 1H:
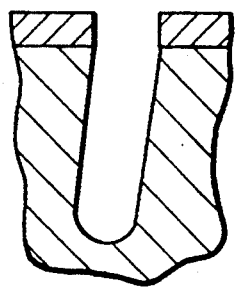

Examples of the semiconductor substrates used in this invention are Si single crystal wafers and SOI (Si On Insulator) wafers.

Examples of the mask material used in this invention are silicon oxide, particularly $SiO_2$, and $Si_3N_4$.

Examples of the dry etching method of this invention are the RIE (Reactive Ion Etching) method, the magnetron RIE method, and the ECR (Electron Cyclotron Resonance) method.

Examples of the etchant gas comprising at least bromine (Br containing gas) of this invention are a gas comprising at least one of HBr and $Br_2$.

Examples of the cleaning gas comprising a halogen (X containing gas) of this invention are a gas comprising at least one of $NF_3$, $CF_4$, $C_2F_6$, $Cl_2$ and $SF_6$.

An example of the reactive gas of this invention is an oxygen containing gas (hereinafter referred to as "$O_2$ gas"). The $O_2$ gas may further contain an inert gas such as helium, argon, neon, xenon, or contain nitrogen. The $O_2$ gas preferably comprises 1% or more of oxygen gas.

This invention will now be explained based on concrete embodiments.

As a dry etching device, an RIE (Reactive Ion Etching) device as shown in FIG. 3 was used. An ECR (Electron Cyclone Resonance) device can, of course, be used instead of the RIE device. In FIG. 3, an etching chamber 301 is provided with upper electrode 304 and lower electrode 305, and a Si substrate 308 is placed on the lower electrode 305, an etching gas as mentioned below is introduced via the entrance 302 and exhausted via an exit 303. Across these electrodes, electric power at 13.56 MHz is provided from a high frequency power source 306, gas plasma is generated between the electrodes, and etching of the Si substrate is carried out. The RIE device is provided with a magnet coil 307 around the etching chamber, thus it is in a magnetron mode.

In Example 1, together with the above RIE device, an etching gas mixture was used, the etching gas mixture comprising HBr, $SF_6$, $SiF_4$, and $O_2$ gas containing He gas ($O_2$ gas containing He gas is represented as "He, $O_2$ gas" in this specification and drawing). In comparative Examples 1 to 4, HBr gas was used as a main component, and in some cases, F system gas, Cl system gas, or $O_2$ gas was used in admixture with the HBr gas. In comparative Example 5, Cl system gas was used as a main component. In comparative Example 6, F system gas and Cl system gas were used as main components. He, $O_2$ gas had a composition wherein the He:$O_2$ ratio is 7:3. However, if the flow rate of oxygen ($O_2$ only) gas can be controlled, oxygen gas can be used. Further, $O_2$ gas may contain other inert gas.

Using the above device and gases of Example 1 and Comparative Examples 1 to 6, etchings were carried out under the conditions described in Table 1.

TABLE 1

| Example or Comparative Example | Example 1 | Comp. Exam. 1 | Comp. Exam. 2 | Comp. Exam. 3 |
|---|---|---|---|---|
| — | $HBr/SiF_4$/ He, $O_2/SF_6$ | HBR only | $HBR/SF_6$ | $HBr/SiF_4$ /He, $O_2$ |
| HBr Flow rate (SCCM) | 40 | 80 | 20 | 22 |
| $SiF_4$ Flow Rate (SCCM) | 4 | — | — | 5 |
| He, $O_2$ Flow Rate (SCCM) | 8 | — | — | 10 |
| $SF_6$ Flow Rate (SCCM) | 3 | — | 2 | — |
| $Cl_2$ Flow Rate (SCCM) | — | — | — | — |
| $SiCl_4$ Flow Rate (SCCM) | — | — | — | — |
| $N_2$ Flow Rate (SCCM) | — | — | — | — |
| Ar Flow Rate (SCCM) | — | — | — | — |
| R F Power (W) | 400 | 400 | 400 | 420 |
| Pressure (mTorr) | 80 | 100 | 100 | 100 |
| Magnetic Field Strength (Gauss) | 55 | 55 | 55 | 55 |

| Comparative Example | 4 | 5 | 6 |
|---|---|---|---|
| — | $HBr/Cl_2$ /He, $O_2$ | $SiCl_4/Cl_2$ | $SiCl_4/SF_6$ /$N_2$/Ar |
| HBr Flow Rate (SCCM) | 30 | — | — |
| $SiF_4$ Flow Rate (SCCM) | — | — | — |
| He, $O_2$ Flow Rate (SCCM) | — | — | — |
| $SF_6$ Flow Rate (SCCM) | — | — | 5 |
| $Cl_2$ Flow Rate (SCCM) | 4 | 50 | — |
| $SiCl_4$ Flow Rate (SCCM) | — | 20 | 16 |
| $N_2$ Flow Rate (SCCM) | — | — | 5 |
| Ar Flow Rate (SCCM) | — | — | 20 |
| R F Power (W) | 150 | 500 | — |
| Pressure (mTorr) | 20 | 7 | 15 |
| Magnetic Field | 75 | 70 | — |

TABLE 1-continued

Strength (Gauss)

Results obtained in Example 1 and Comparative Example 1 to 6 are shown in Table 2.

TABLE 2

| | Etching Gas | Side Wall Angle | Selectivity Against $SiO_2$ | Bowing | Etching Rate (nm/min.) |
|---|---|---|---|---|---|
| Example 1 | $HBr/SiF_4/$ $He, O_2/SF_6$ | 89.2° | 120 | no | 750 |
| Com. Exam. 1 | HBr only | 85° | 25 | no | 750 |
| Com. Exam. 2 | $HBr/SF_6$ | 88° | 25 | no | 800 |
| Com. Exam. 3 | $HBr/SiF_4$ $/He, O_2$ | x[1) | 52 | — | 1200 |
| Com. Exam. 4 | $HBr/Cl_2$ $/He, O_2$ | 91° | 21 | yes | 350 |
| Com. Exam. 5 | $SiCl_4/Cl_2$ | 87° | 15 | no | 1300 |
| Com. Exam. 6 | $SiCl_4/SF_6$ $/N_2/Ar$ | 88° | 20 | no | 250 |

[1)No etching was attained.

As apparent from Table 2, Example 1 has a far higher selectivity ratio against $SiO_2$, and produces a better configuration than the Comparative Examples. As is apparent from Comparative Example 3, this is because it is insufficient to only mix $SiF_4$ as a F system gas into the etching gas, in order to vaporize $SiBr_x$ (x is 1 to 4) formed by etching reaction, and it is considered to be efficient for vaporizing $SiBr_x$ to mix $SF_6$ having small decomposition energy which is apparent from publicly known data shown in Table 3 and 4.

TABLE 3

| | Temperature(°C.) at 50 kPa of vapour pressure | Boiling Point(°C.) | Volatility |
|---|---|---|---|
| $SiBr_4$ | — | 153 | low |
| $SiBr_3F$ | 64.6 | 83.8 | |
| $SiBr_2F_2$ | −2.3 | 13.7 | |
| $SiBrF_3$ | −56 | −41.7 | |
| $SiF_4$ | −100 | −94.8 | high |

TABLE 4

| Reaction Gas | F Number | Bond Energy (kJ/mol) | Boiling Point(°C.) | Toxicity |
|---|---|---|---|---|
| $NF_3$ | 3 | 301 | −120 | toxic |
| $CF_4$ | 4 | 536 | −128 | not |
| $C_2F_6$ | 6 | 536 | −78 | not |
| $SF_6$ | 6 | 343 | −63.7 | not |
| $CHF_3$ | 3 | 536 | −84.4 | not |
| $CH_2F_2$ | 2 | 536 | −52 | not |
| $CH_3F$ | 1 | 536 | −79 | not |
| $SiF_4$ | 4 | 540 | −94.8 | toxic |

On the other hand, $O_2$ gas forms $SiO_2$ by the reaction shown in the following formulas (1) and (2) during etching. This $SiO_2$ were found to prevent the disappearance of the $SiO_2$ mask material, or to selectively deposit on the mask material and greatly improve the selectivity ratio against $SiO_2$.

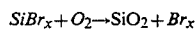

$$SiBr_x + O_2 \rightarrow SiO_2 + Br_x \quad (1)$$

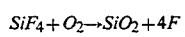

$$SiF_4 + O_2 \rightarrow SiO_2 + 4F \quad (2)$$

Figure 5:
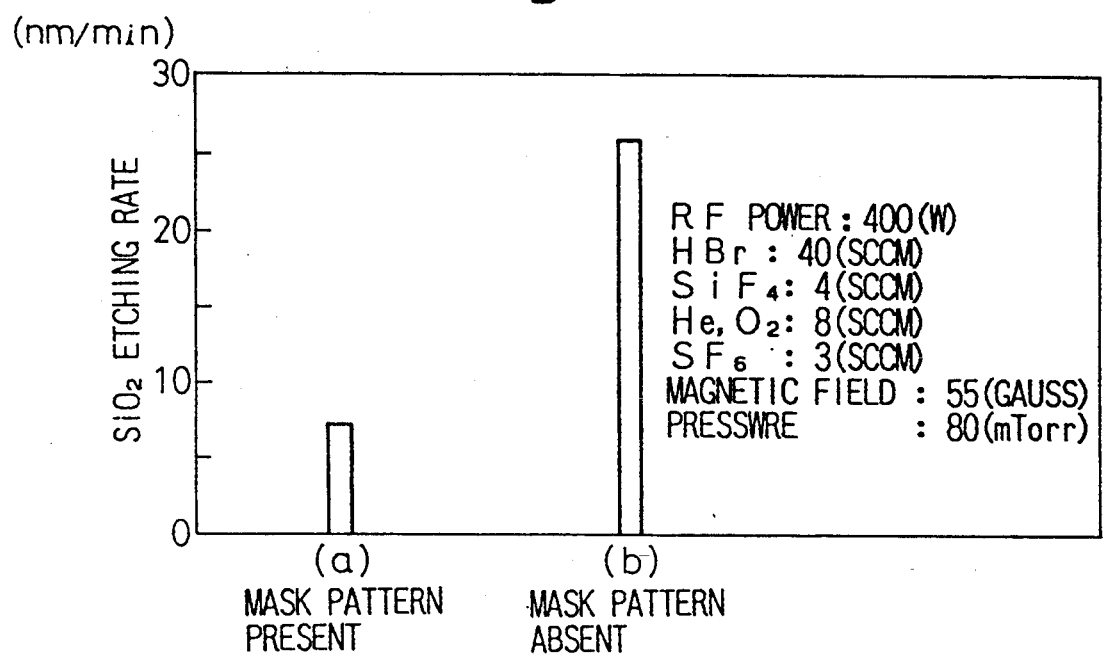
FIG. 5 is a diagram comparing etching speeds of the samples having a $SiO_2$ mask pattern and having no $SiO_2$ mask pattern.

In comparing examples of etching samples having mask pattern as shown in FIG. 4A and not having mask pattern as shown in FIG. 4B, results shown in FIG. 5 and Table 5 were obtained. The results show that the etching speed of $SiO_2$ is decreased through the fact that Si is being etched. Thus formula (1) is presumed to be true.

TABLE 5

| | (a) mask pattern present | (b) mask pattern not present |
|---|---|---|
| Si etching area | 15% | 0% |
| $SiO_2$ etching area | 85% | 100% |
| generation of $SiBr_x$ | considerable | none or a very small amount |

Figure 6:
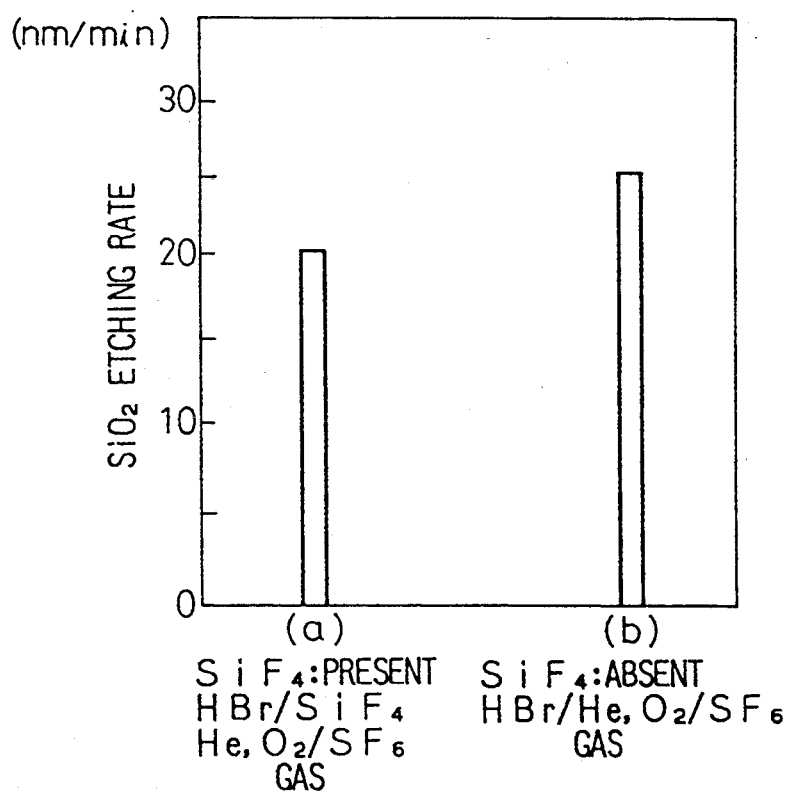
FIG. 6 is a diagram comparing etching speeds in the presence and absence of $SiF_4$ gas.

Further, from the results shown in FIG. 6, wherein experiments were carried out in same way as in Example 1 except that in case (b) $SiF_4$ was not used, it is apparent that when He, $O_2$ is present, $SiF_4$ inhibits the etching rate of $SiO_2$ and improves the selectivity ratio against $SiO_2$. Thus formula (2) is presumed to be true.

Figure 7:
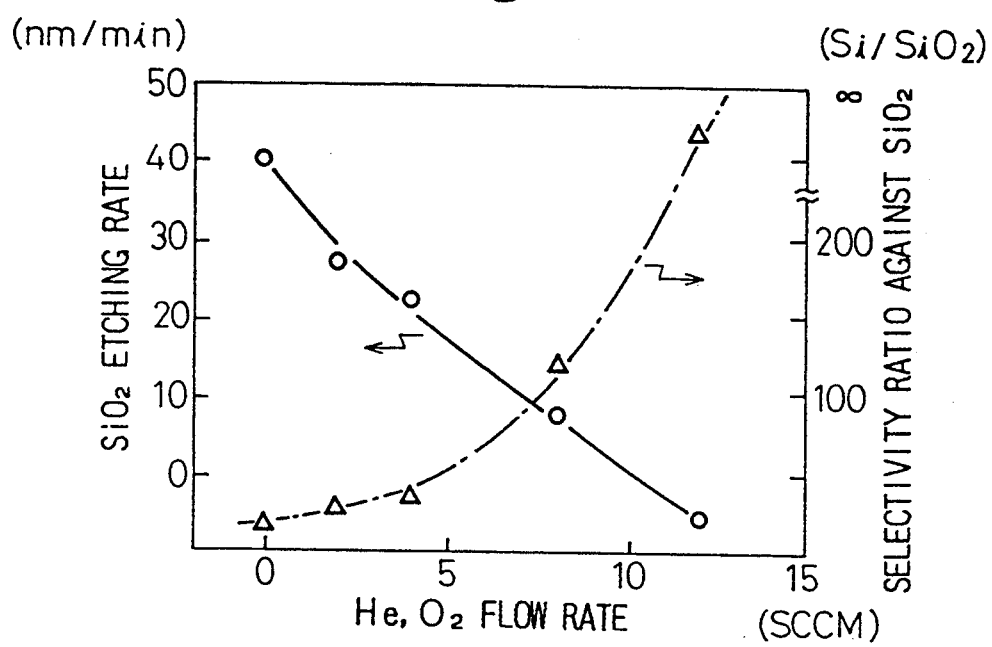
FIG. 7 is a diagram showing the dependency of the selectivity ratio against $SiO_2$ on the He, $O_2$ gas flow rate.
Figure 8:
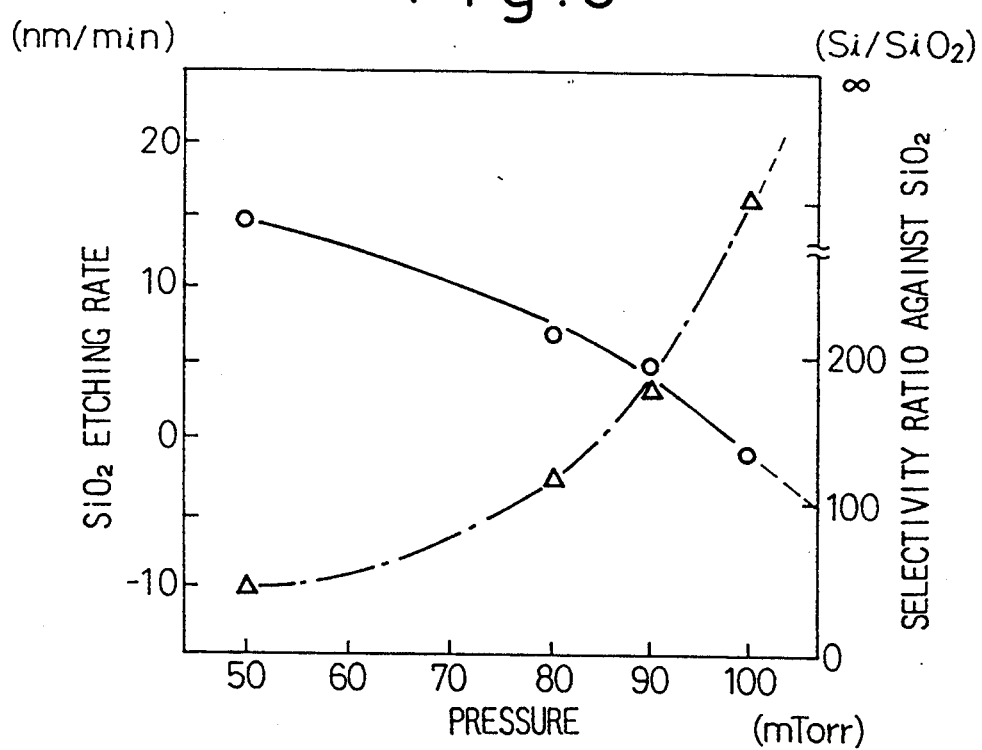
FIG. 8 is a diagram showing the dependency of the selectivity ratio against $SiO_2$ on the pressure of the etching gas mixture.

The $SiO_2$ etching rate and the selectivity against $SiO_2$ on He, $O_2$ gas flow rate and etching gas mixture pressure are shown in FIGS. 7 and 8, where experiments were carried out under the same condition as Example 1 except that He, $O_2$ gas flow rate was changed in case of FIG. 7, and etching gas mixture pressure was changed in case of FIG. 8. In these Figures, the larger the He, $O_2$ gas flow rate or the etching gas mixture pressure, the larger the selectivity against $SiO_2$ is. As is apparent from this result, by making the He, $O_2$ gas flow rate 2 SCCM or higher, preferably 5 SCCM or higher, the selectivity against $SiO_2$ can be made far higher than the conventional upper limit of 25, and a deeper trench can be made.

Figure 9:
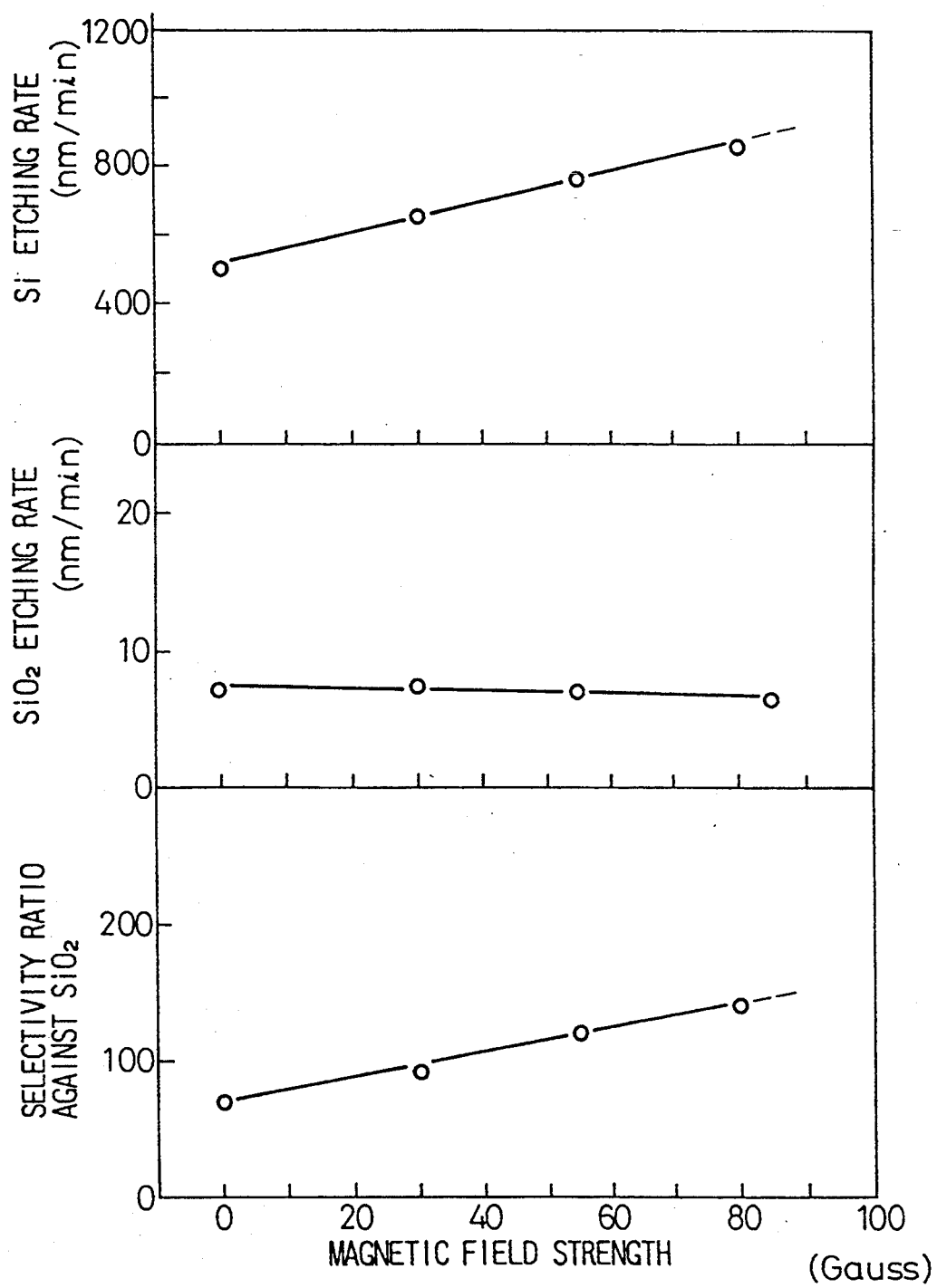
FIG. 9 is a diagram showing the dependency of the selectivity ratio against $SiO_2$ on the magnetic field strength.

Further, when the magnetic field strength was changed and the changes in the selectivity against $SiO_2$ were examined under the same conditions as in Example 1 except that magnetic field strength was changed, the selectivity against $SiO_2$ was also increased as the magnetic field strength was increased as shown in FIG. 9. Therefore, it is apparent that this also allows deeper trenches to be obtained.

It was confirmed that a good side wall angle and bottom configuration, and a sufficient reproducibility for trenches can be obtained in the range of conditions shown in Table 6.

TABLE 6

| Parameter | Range of Condition |
|---|---|
| HBr Flow Rate (SCCM) | 10–100 |
| $SiF_4$ Flow Rate (SCCM) | 0–20 |
| He, $O_2$ Flow Rate (SCCM) | 2–20 |
| $SF_6$ Flow Rate (SCCM) | 2–10 |
| Pressure (mTorr) | 50–150 |
| High Frequency Power (W) | 200–600 |
| Magnetic Field Strength (Gauss) | 0–100 |

From the above, the gas composition of Example 1 can give a taper of trench side wall closest to 90° and greatly improves the selectivity against $SiO_2$, and is most excellent in forming trenches.

When $NF_3$ was used instead of $SF_6$ in Example 1, similar results were obtained. When a mask of $Si_3N_4$ was used instead of SiO$_2$ mask in Example 1, similar results were obtained.

Figure 10:
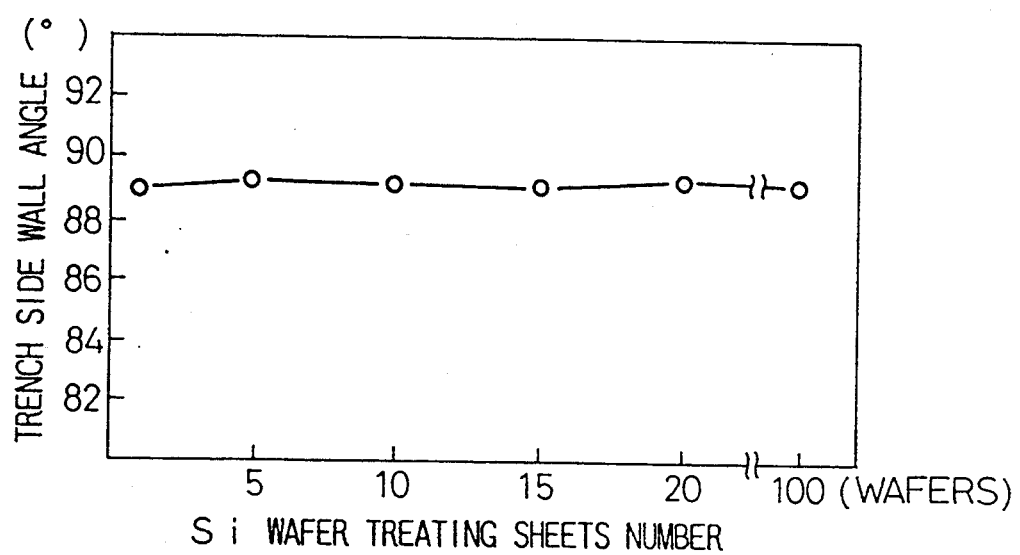
FIG. 10 is a diagram showing the dependency of the trench angle on the number of etching cycles.

The etching process stability was examined. Trench formation according to the same process as Example 1 could be repeated 100 times with a trench side wall of 89.2°±0.5°, as shown in FIG. 10, which is sufficiently stable for the purpose of commercial production.

Figure 11A:
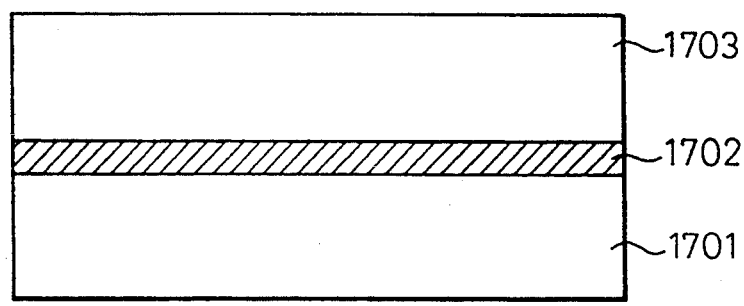
FIGS. 11A through 11C are schematic cross sectional views showing formation of trenches on an SOI substrate in accordance with this invention.
Figure 11B:
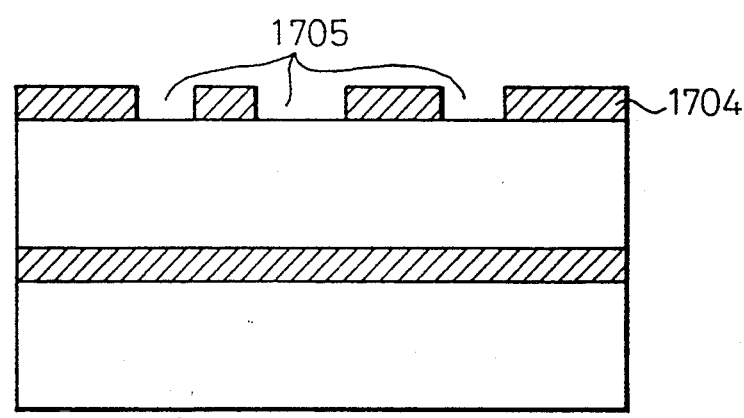
Figure 11C:
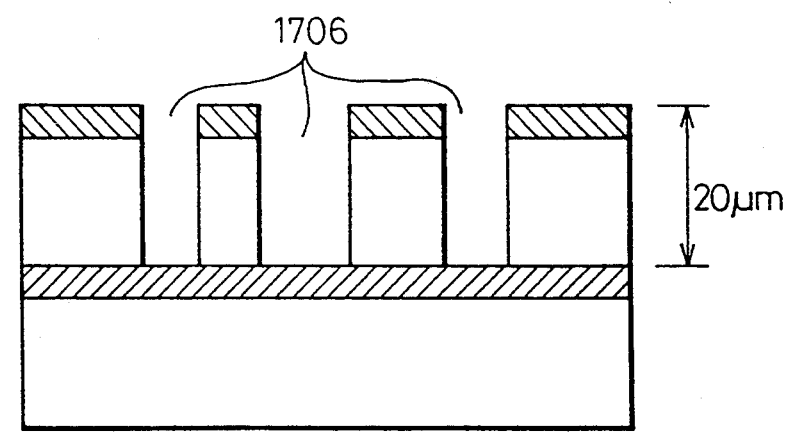

Another example will be shown, wherein trenches are formed on the surface of an SOI (Silicon On Insulator) substrate as shown in FIGS. 11A to 11C. The SOI substrate has a composition as shown in FIG. 11A, wherein on a Si substrate there is an insulator layer 1702 of 1 μm thickness, and on which there is a Si layer 1703 (20 μm thick). When a mask pattern was formed on the surface of the Si layer 1703 (FIG. 11B), and trenches were formed, excellent, 20 μm deep trenches 1706 were obtained. For the purpose of confirmation, a 20% excessive etching process was carried out. However, the 1 μm thick insulation layer 1702 could not be etched, because the selectivity ratio against SiO$_2$ was too large.

Trenches having width of 1 to 120 μm and nearly the same configuration could be obtained, which gives a large degree of freedom of design for the practical manufacture of IC.

We claim:

1. A process for forming trenches on a surface of a semiconductor substrate by forming a mask on the surface of the semiconductor, which prescribes the position of the trenches; and dry etching the semiconductor surfaces using a gas mixture comprising an etchant gas comprising at least bromine which etches the semiconductor surface to form trenches, a cleaning gas comprising a halogen which evaporates residue formed by the etching, and an O$_2$ containing gas capable of reacting with a material formed during the etching and of decreasing the wastage of the mask by the etchant gas, the flow rate of said bromine being 10 to 100 SCCM, the flow rate of said O$_2$ being 0.6 to 6 SCCM, the pressure of said gas mixture being 50 to 150 mTorr, and using a high frequency power of 200 to 600 watts.

2. A method according to claim 1, wherein said reactive gas comprises 1% or more of oxygen gas based on said etchant gas.

3. A process for forming trenches on a surface of a silicon substrate by forming a mask of silicon oxide on the surface of the silicon, which prescribes the position of the trenches; and dry etching the silicon surface using a gas mixture comprising an etchant gas comprising at least bromine comprising at least one of H Br and Br$_2$ which etches the silicon surface to form trenches, a cleaning gas comprising a halogen which evaporates residue formed by said etching, and an oxygen containing gas capable of reacting with material formed during the etching and of decreasing the wastage of the mask by the etchant gas, the flow rate of said bromine being 10 to 100 SCCM, the flow rate of said O$_2$ being 0.6 to 6 SCCM, the pressure of said gas mixture being 50 to 150 mTorr, and using a high frequency power of 200 to 600 watts.

4. A method according to claim 3, wherein said etchant gas further comprises SiF$_4$.

5. A method according to claim 3, wherein said cleaning gas comprises at least one of SF$_6$ or NF$_3$.

6. A method according to claim 3 wherein the oxygen containing gas further comprises helium.

7. A method according to claim 3 wherein the bromine is H Br, the etchant gas further comprises Si F$_4$, and the halogen is SF$_6$.

* * * * *